(12) United States Patent
Yoshikawa et al.

(10) Patent No.: US 8,923,008 B2
(45) Date of Patent: Dec. 30, 2014

(54) CIRCUIT BOARD AND METHOD FOR MANUFACTURING CIRCUIT BOARD

(75) Inventors: Kazuhiro Yoshikawa, Ogaki (JP); Toshiki Furutani, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 338 days.

(21) Appl. No.: 13/404,173

(22) Filed: Feb. 24, 2012

(65) Prior Publication Data
US 2012/0228012 A1 Sep. 13, 2012

Related U.S. Application Data

(60) Provisional application No. 61/450,322, filed on Mar. 8, 2011.

(51) Int. Cl.
*H05K 1/18* (2006.01)
*H05K 7/12* (2006.01)
*H01L 21/56* (2006.01)
*H01L 25/10* (2006.01)
*H01L 23/31* (2006.01)

(52) U.S. Cl.
CPC .............. *H05K 1/188* (2013.01); *H01L 21/568* (2013.01); *H05K 1/185* (2013.01); *H05K 2201/10674* (2013.01); *H05K 2203/1469* (2013.01); *H01L 25/105* (2013.01); *H01L 2225/1035* (2013.01); *H01L 2225/1058* (2013.01); *H01L 2224/16225* (2013.01); *H01L 2224/32225* (2013.01); *H01L 2224/73204* (2013.01); *H01L 2924/3511* (2013.01); *H01L 2224/45147* (2013.01); *H01L 23/3128* (2013.01); *H01L 23/3135* (2013.01); *H01L 2924/00014* (2013.01); *H01L 2224/16* (2013.01)

USPC ........... 361/761; 174/257; 174/262; 361/764; 361/767

(58) Field of Classification Search
CPC ....... H05K 1/092; H05K 1/095; H05K 1/182; H01L 23/5389; H01L 2224/16056; H01L 2924/14; H01L 2924/15312; H01L 2924/1533
USPC ........................ 174/257, 260–262, 264–266; 361/760–764, 767
See application file for complete search history.

(56) References Cited

U.S. PATENT DOCUMENTS

| | | | |
|---|---|---|---|
| 7,294,529 B2 * | 11/2007 | Tuominen | 438/107 |
| 7,656,015 B2 * | 2/2010 | Wong et al. | 257/685 |
| 7,935,893 B2 | 5/2011 | Tanaka et al. | |
| 2004/0042185 A1 * | 3/2004 | Kung et al. | 361/760 |
| 2005/0029642 A1 * | 2/2005 | Takaya et al. | 257/678 |
| 2008/0196930 A1 * | 8/2008 | Tuominen et al. | 174/260 |
| 2010/0243299 A1 | 9/2010 | Kariya et al. | |
| 2011/0061909 A1 * | 3/2011 | Palm et al. | 174/257 |

(Continued)

FOREIGN PATENT DOCUMENTS

JP 4205749 B 10/2008

*Primary Examiner* — Hoa C Nguyen
(74) *Attorney, Agent, or Firm* — Oblon, Spivak, McClelland, Maier & Neustadt, L.L.P.

(57) ABSTRACT

A circuit board includes an insulation layer having a first surface and a second surface on the opposite side of the first surface, an electronic component positioned in the insulation layer and having a terminal, a conductive pattern formed on the second surface of the insulation layer and electrically connected to the terminal, and an insulative film formed on the second surface of the insulation layer and on the conductive pattern. The terminal of the electronic component has a protruding portion which protrudes from the second surface of the insulation layer.

20 Claims, 16 Drawing Sheets

(56) References Cited

U.S. PATENT DOCUMENTS

2011/0139498 A1    6/2011   Kunieda et al.
2012/0153493 A1*   6/2012   Lee et al. ...................... 257/774
2013/0175075 A1*   7/2013   Kivikero et al. .............. 174/260

* cited by examiner (A)

(B)

(A)

(B)

(A)

(B)

(C)

(D)

(A)

(B)

(C)

CIRCUIT BOARD AND METHOD FOR MANUFACTURING CIRCUIT BOARD

CROSS-REFERENCE TO RELATED APPLICATIONS

The present application is based on and claims the benefit of priority to U.S. Application No. 61/450,322, filed Mar. 8, 2011, the entire contents of which are incorporated herein by reference.

BACKGROUND OF THE INVENTION

1. Field of the Invention

The present invention relates to a circuit board formed by accommodating an electronic component such as a semiconductor element in an insulation layer, and to a method for manufacturing such a circuit board.

2. Discussion of the Background

Japanese Patent No. 4205749 describes an electronic module in which a semiconductor element is built into an insulation layer. The electronic module is manufactured by the following process: (1) On a copper foil with a carrier, a semiconductor element is mounted via an adhesive agent in such a way that a terminal faces downward; (2) An insulation layer is formed for encapsulating the semiconductor element; (3) The carrier is removed; (4) After the carrier is removed, an opening penetrating through the copper foil and the adhesive layer and reaching a pad of the semiconductor element is formed by a laser; and (5) A via is formed in the opening and a conductive pattern is also formed to be connected to the via. The contents of this publication are incorporated herein by reference in their entirety.

SUMMARY OF THE INVENTION

According to one aspect of the present invention, a circuit board includes an insulation layer having a first surface and a second surface on the opposite side of the first surface, an electronic component positioned in the insulation layer and having a terminal, a conductive pattern formed on the second surface of the insulation layer and electrically connected to the terminal, and an insulative film formed on the second surface of the insulation layer and on the conductive pattern. The terminal of the electronic component has a protruding portion which protrudes from the second surface of the insulation layer.

According to another aspect of the present invention, a method for manufacturing a circuit board includes forming a recessed portion or a penetrating hole in a support member, inserting a portion of a terminal of an electronic component in the recessed portion or the penetrating hole, forming an insulation layer on the support member such that the electronic component is encapsulated in the insulation layer, removing the support member from a surface of the insulation layer such that the portion of the terminal of the electronic component protrudes from the surface of the insulation layer, and forming on the surface of the insulation layer a conductive pattern such that the conductive pattern is electrically connected to the terminal of the electronic component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
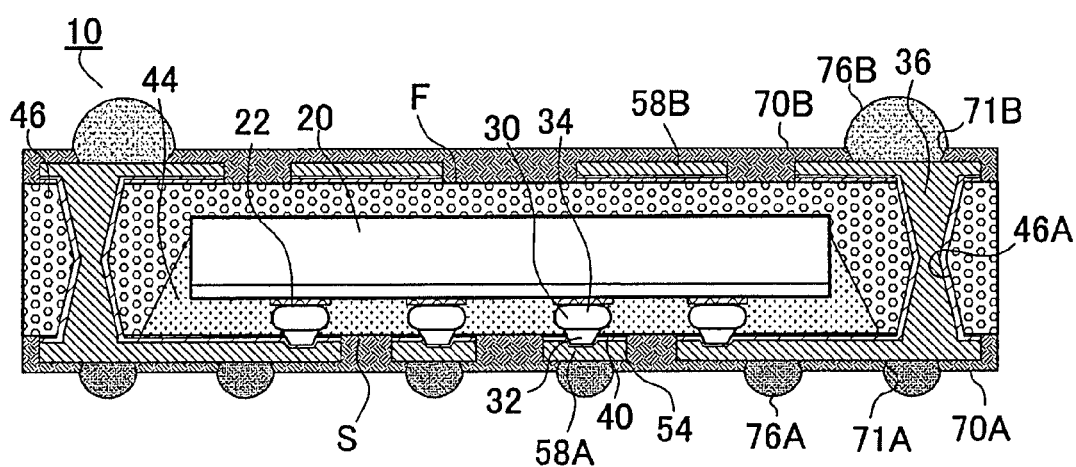
FIG. 1 is a cross-sectional view of a circuit board according to a first embodiment of the present invention.

The embodiments will now be described with reference to the accompanying drawings, wherein like reference numerals designate corresponding or identical elements throughout the various drawings.

First Embodiment

Circuit board 10 of the first embodiment is described with reference to FIG. 1. Circuit board 10 has insulation layer 46 having first surface (F) and second surface (S) opposite first surface (F); electronic component 20 (semiconductor element 20) accommodated in insulation layer 46; first conductive pattern (58A) formed on second surface (S) of insulation layer 46; terminal 30 formed on pad 22 of semiconductor element 20; and first insulative film (70A) formed on second surface (S) of insulation layer 46 to cover first conductive pattern (58A). Insulation layer 46 is preferred to include reinforcing material such as glass cloth and aramid fiber.

Opening portion (71A) exposing at least part of first conductive pattern (58A) is formed in first insulative film (70A). First conductive pattern (58A) exposed through opening portion (71A) works as a solder pad. Solder bump (76A) is formed in opening portion (71A). Furthermore, second conductive pattern (58B) is formed on first surface (F) of insulation layer 46. Insulation layer 46 has penetrating hole (46A). Through-hole conductor 36 is formed in penetrating hole (46A). First conductive pattern (58A) and second conductive pattern (58B) are electrically connected by through-hole conductor 36.

Second insulative film (70B) is formed on first surface (F) of insulation layer 46 to cover second conductive pattern (58B). Opening portion (71B) exposing at least part of second conductive pattern (58B) is formed in second insulative film (70B). Second conductive pattern (58B) exposed through opening portion (71B) works as a solder pad. Solder bump (76B) is formed in opening portion (71B). Adhesive agent 44 to fix semiconductor element 20 is formed in a region directly under semiconductor element 20. In the present embodiment, adhesive agent 44 is included in insulation layer 46. Namely, second surface (S) of insulation layer 46 includes the surface of adhesive agent 44.

Terminal 30 formed on pad 22 of semiconductor element 20 is described as follows. Terminal 30 is formed in a protruding shape. Terminal 30 is a stud bump made of Cu, Au or the like. In the present embodiment, a stud bump made of Cu is used from the viewpoint of electric resistance. Hereinafter, terminal 30 is referred to as stud bump 30.

Figure 2:
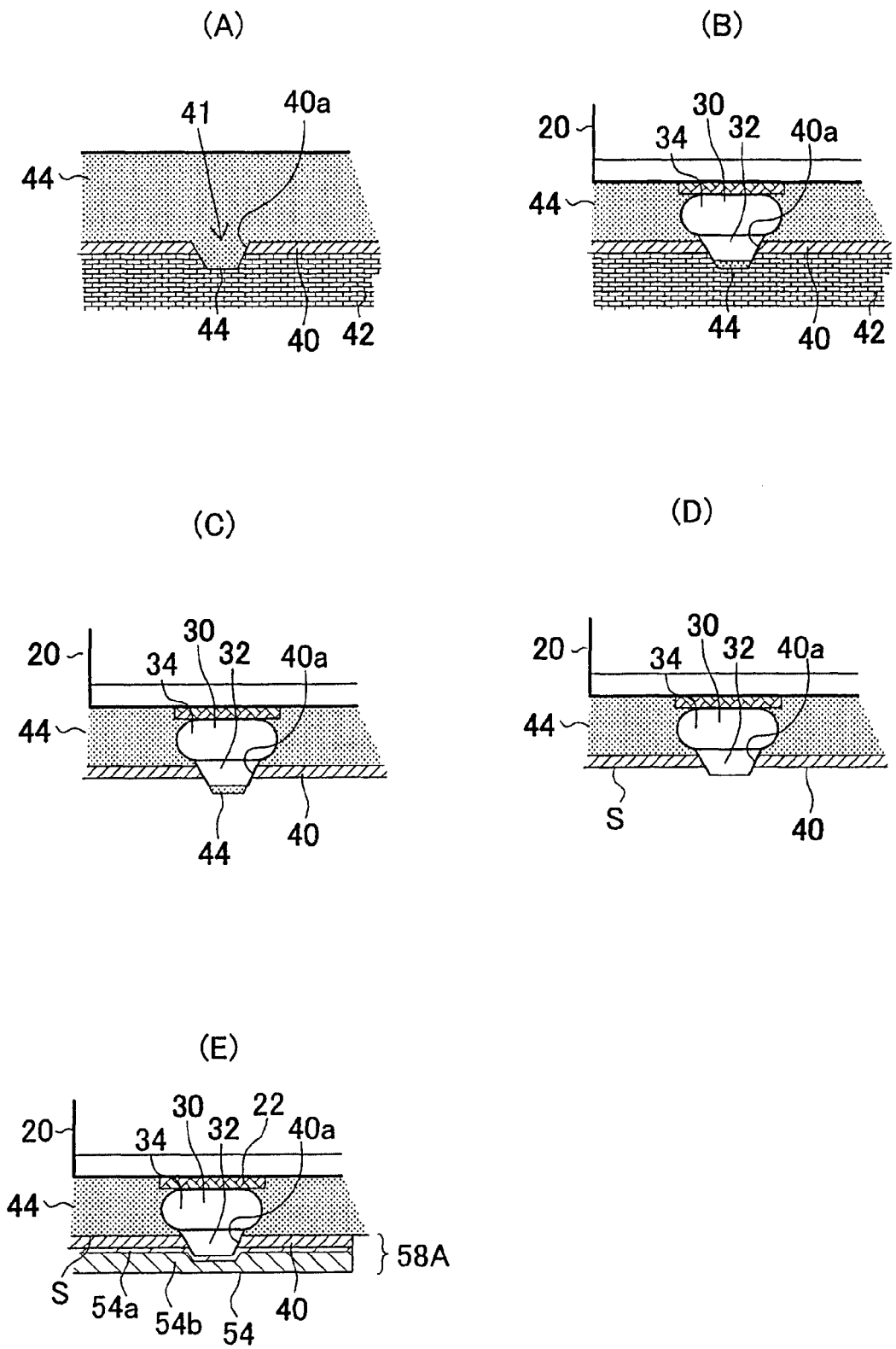
FIGS. 2(A)-2(E) are cross-sectional views of essential parts of a circuit board according to the first embodiment.
Figure 3:
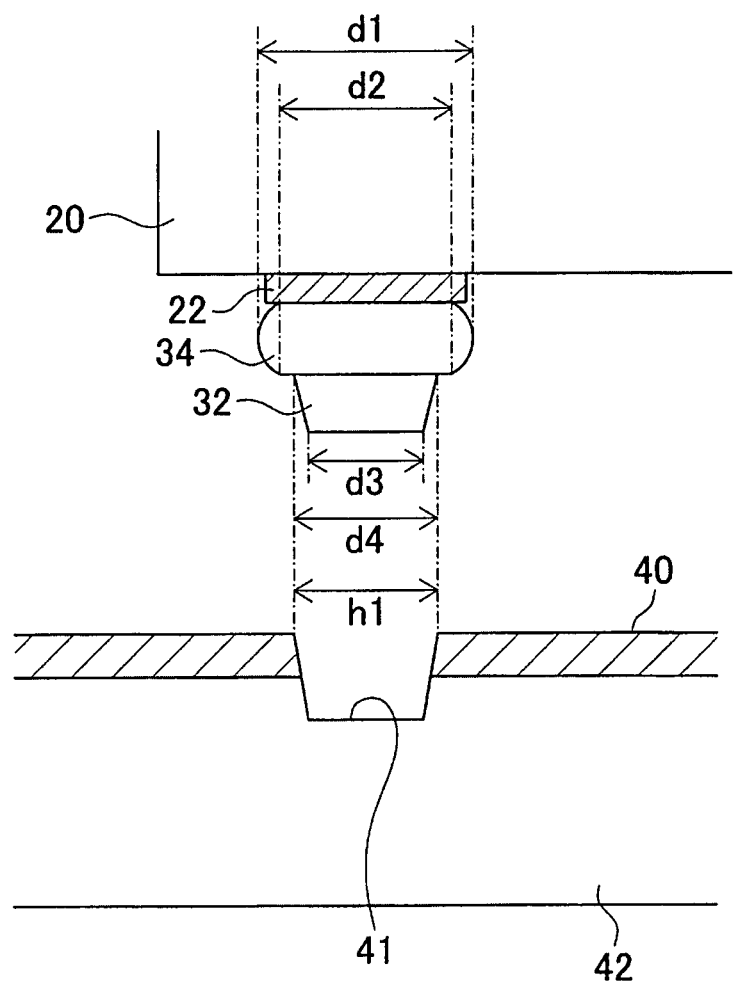
FIG. 3 is a view to illustrate an external diameter of a stud bump.

FIG. 2(E) shows a magnified view of stud bump 30. In the present embodiment, stud bump 30 made of Cu is formed on aluminum pad 22 of semiconductor element 20. Stud bump 30 is made up of base 34 shaped substantially in a disc and of protruding end portion 32 formed on base 34. The diameter of end portion 32 decreases toward the tip (farther from base 34). The tip surface of end portion 32 is shaped substantially flat. As shown in FIG. 3, maximum diameter (d1) of base 34 is approximately 65 μm. Minimum diameter (d2) of base 34 is approximately 60 μm. Minimum diameter (d3) of end portion 32 is approximately 30 μm. Maximum diameter (d4) of end portion 32 is approximately 55 μm.

In the present embodiment, maximum diameter (d1) of base 34 means the diameter of substantially the central portion of base 34 in a thickness direction. Minimum diameter (d2) of base 34 means the diameter at the portion connected to end portion 32. Minimum diameter (d3) of end portion 32 means the diameter at the tip surface of end portion 32. Maximum diameter (d4) of end portion 32 means the diameter at the portion connected to base 34.

Figure 4:
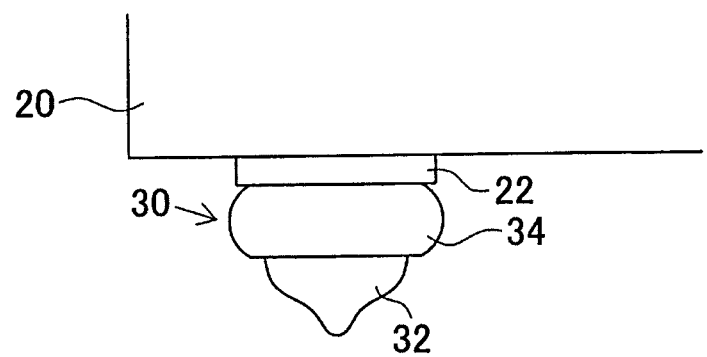
FIG. 4 is a view showing a second example of a stud bump.

The shape of end portion 32 is not limited to the above. Its tip may be shaped substantially as a triangular pyramid as shown in FIG. 4.

Next, the following describes the connected structure of stud bump 30 and conductive pattern (58A) in the present embodiment (see FIG. 2(E)). Conductive pattern (58A) is made up of copper foil 40 formed on second surface (S) of insulation layer 46 and of copper-plated film 54 formed on copper foil 40. Copper-plated film 54 is made up of electroless plated film (54a) on copper foil 40 and of electrolytic plated film (54b) on electroless plated film (54a). Copper foil 40 has penetrating hole (40a) (see FIG. 2(A)). The diameter of penetrating hole (40a) is substantially the same as diameter (d4) of end portion 32 of stud bump 30.

Meanwhile, end portion 32 of stud bump 30 protrudes from second surface (S) of insulation layer 46. Then, end portion 32 of stud bump 30 penetrates through penetrating hole (40a) while being in contact with the inner wall of penetrating hole (40a) in copper foil 40. The tip of end portion 32 penetrating through penetrating hole (40a) is in direct contact with plated film 54. End portion 32 of stud bump 30 makes contact with plated film 54 not only at its tip surface but also at its side surface. Accordingly, the contact area between stud bump 30 and conductive pattern (58A) is sufficiently secured, enhancing reliability between them.

Figure 5:
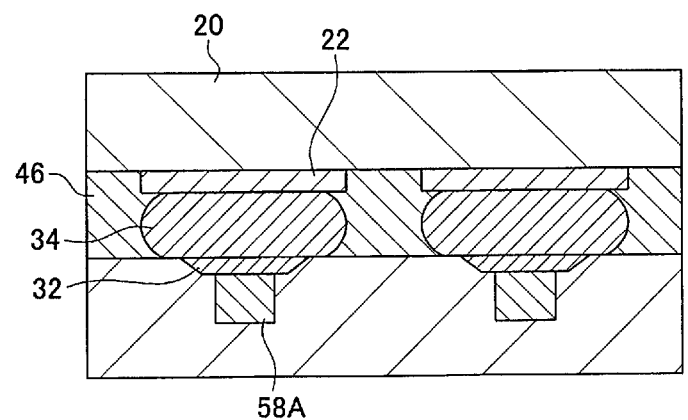
FIGS. 5(A)-5(B) are views showing a third example of a stud bump.
Figure 5:
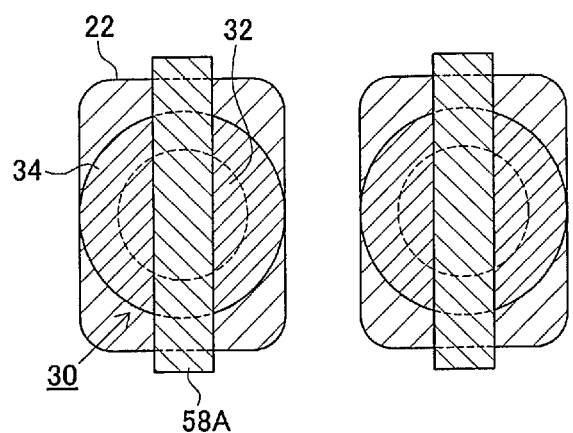
Figure 6:
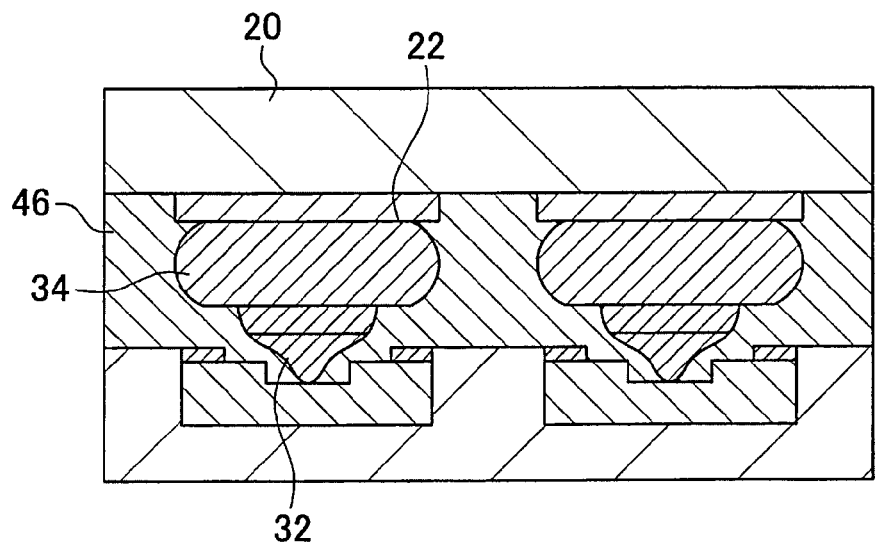
FIGS. 6(A)-6(B) are showing a fourth example of a stud bump.
Figure 6:
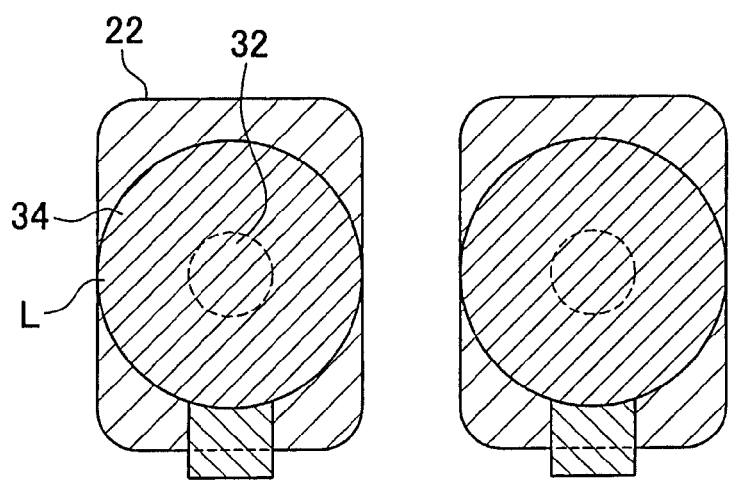

As shown in FIG. 5, when the tip of end portion 32 has a flat surface, conductive pattern (58A) to be connected to end portion 32 is not required to be a land. End portion 32 is connected to the narrowest portion of conductive pattern (58A). Namely, when the tip of end portion 32 has a flat surface, connection reliability between them is sufficiently ensured without connecting end portion 32 to a land. On the other hand, as shown in FIG. 6, when the tip of end portion 32 is shaped substantially as a triangular pyramid, conductive pattern (58A) to be connected to end portion 32 is preferred to be land (L). In doing so, their connection reliability tends to be ensured.

Figure 7:
FIGS. 7(A)-7(D) are views of steps for manufacturing a circuit board according to the first embodiment.
Figure 7:
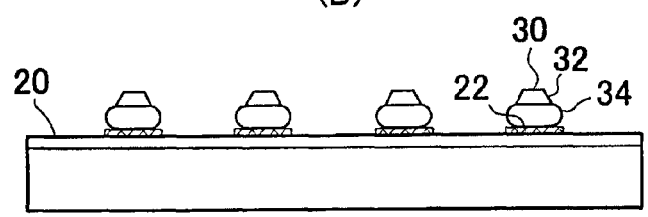
Figure 7:
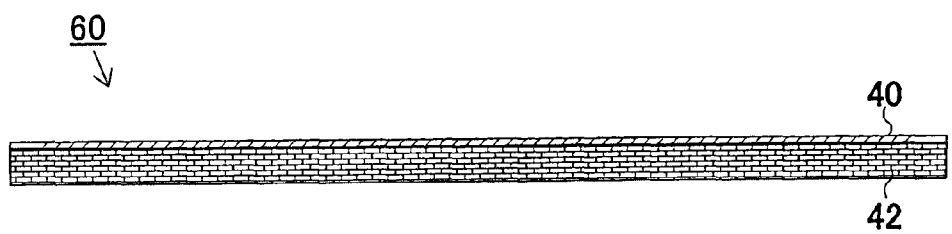
Figure 7:
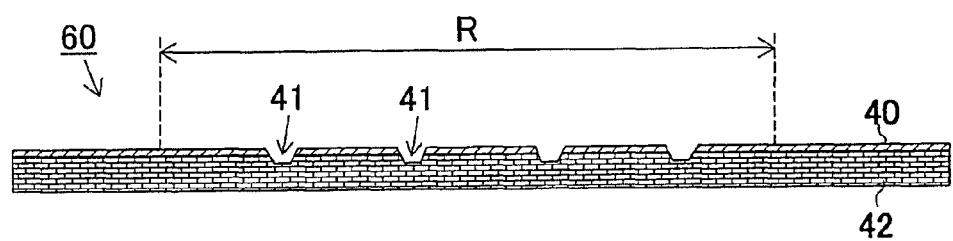
Figure 8:
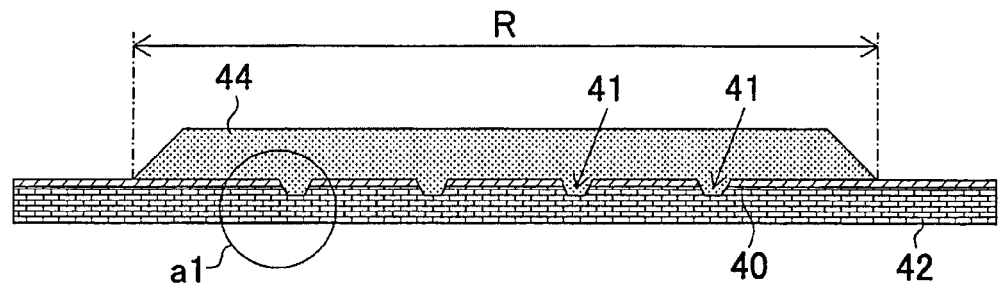
FIGS. 8(A)-(C) are views of steps for manufacturing a circuit board according to the first embodiment.
Figure 8:
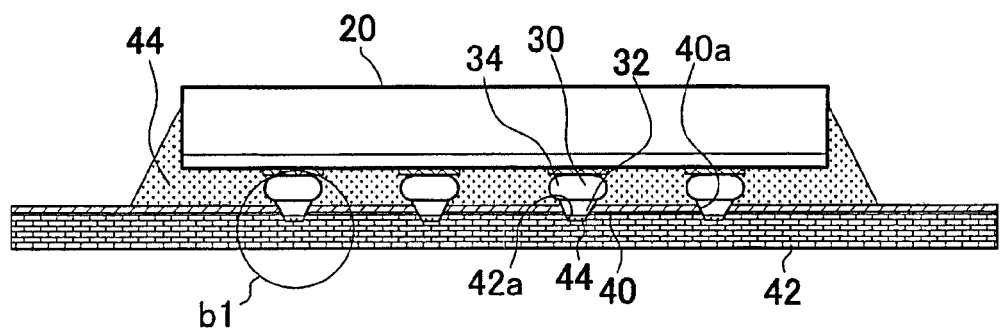
Figure 8:
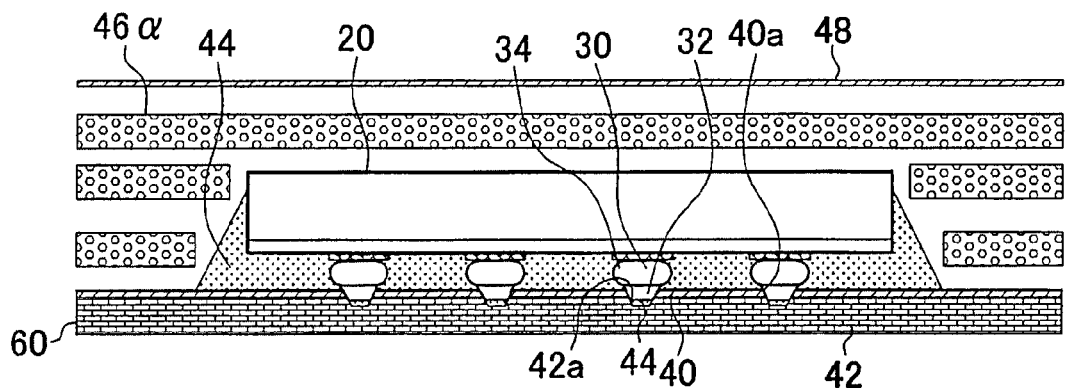
Figure 9:
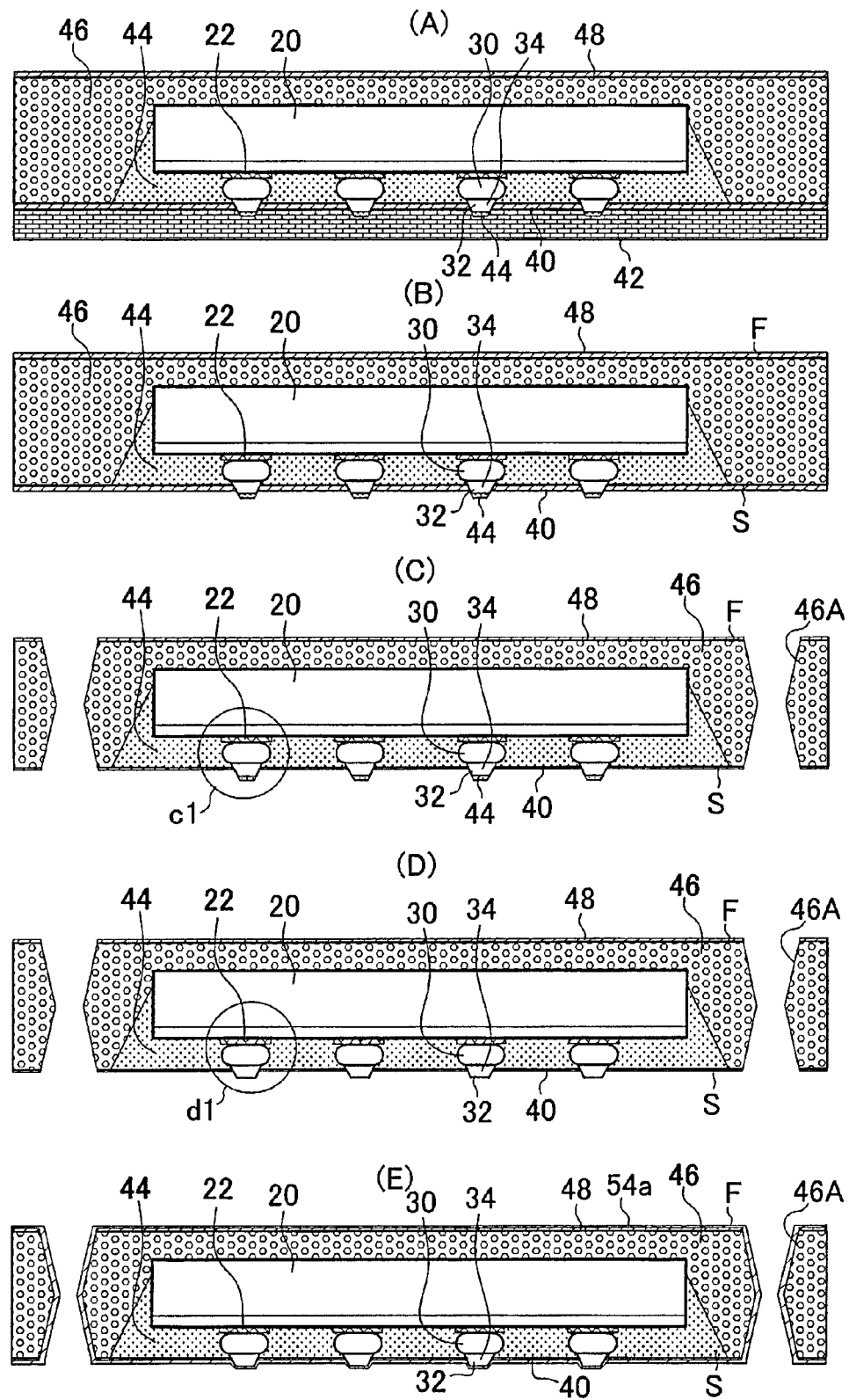
FIGS. 9(A)-(E) are views of steps for manufacturing a circuit board according to the first embodiment.
Figure 10:
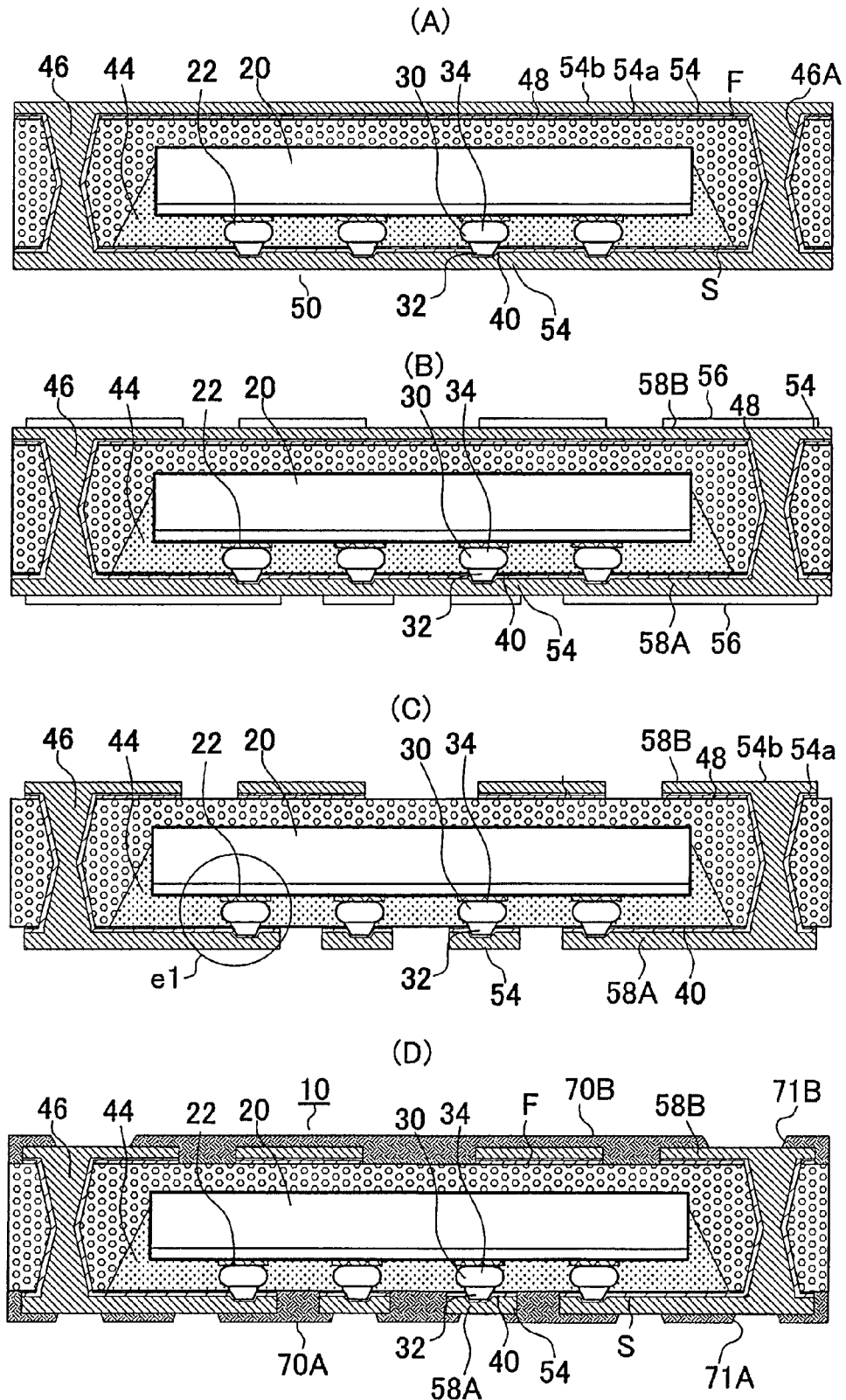
FIGS. 10(A)-10(D) are views of steps for manufacturing a circuit board according to the first embodiment.

A method for manufacturing circuit board 10 of the first embodiment is described with reference to FIGS. 7~10. Stud bump 30 is arranged on pad 22 of semiconductor element 20 which is shown in FIG. 7(A) (FIG. 7(B)). Stud bump 30 is formed by melting a tip of a Cu wire and then cutting the wire, for example. As shown in FIG. 7(C), support member 60, which is formed with base material 42 made of copper, for example, and with copper foil 40 on base material 42, is prepared. As shown in FIG. 7(D), multiple recessed portions 41 are formed at a predetermined interval in region (R) of support member 60 where later-described semiconductor element 20 is positioned. Those recessed portions 41 are formed by a $CO_2$ laser, for example. Recessed portions 41 penetrate through copper foil 40 and reach a mid point of base material 42. The diameter of recessed portions 41 becomes narrower heading inward. Diameter (h1) (diameter at an opening edge) of recessed portions 41 is approximately 60 μm.

As shown in FIG. 8(A), an adhesive agent is applied on the entire surface of region (R). FIG. 2(A) shows a magnified view of recessed portion 41 surrounded by circle (a1) in FIG. 8(A). Then, as shown in FIG. 8(B), end portion 32 of stud bump 30 formed on semiconductor element 20 is inserted in recessed portion 41. FIG. 2(B) shows a magnified view of a stud bump surrounded by circle (b1) in FIG. 8(B). At that time, the inner wall of recessed portion 41 makes contact with end portion 32 of stud bump 30. Accordingly, semiconductor element 20 is solidly fixed. In addition, diameter (h1) of recessed portion 41 is preferred to be smaller than diameter (d2) of base 34 of stud bump 30 (see FIG. 3). In doing so, base 34 of stud bump 30 is suppressed from entering recessed portion 41, and the space directly under semiconductor element 20 is secured.

Next, as shown in FIG. 8(C), multiple prepreg sheets (46α) are laminated on support member 60. Among those multiple prepreg sheets (46α), an opening to accommodate semiconductor element 20 is formed in a predetermined prepreg sheet. Then, copper foil 48 is laminated on outermost prepreg sheet (46α). Accordingly, insulation layer 46 is formed on support member 60. Copper foil 48 is formed on insulation layer 46 (FIG. 9(A)).

As shown in FIG. 9(B), base material 42 is removed from copper foil 40. At that time, at least part of end portion 32 of stud bump 30 is exposed from second surface (S) of insulation layer 46 and the surface of copper foil 40.

As shown in FIG. 9(C), a $CO_2$ laser is irradiated from both the first-surface (F) side and the second-surface (S) side of insulation layer 46 to form penetrating hole (46A) for a through-hole conductor. During that time, adhesive agent 44 is attached to the tip of end portion 32 of stud bump 30. FIG. 2(C) shows a magnified view of a stud bump surrounded by circle (c1) in FIG. 9(C). As shown in FIG. 9(D), adhesive agent 44 attached to the tip of end portion 32 of stud bump 30 is removed by ashing. FIG. 2(D) shows a magnified view of a stud bump surrounded by circle (d1) in FIG. 9(D).

As shown in FIG. 9(E), electroless plated film (54a) is formed on the inner wall of penetrating hole (46A), on the surface of copper foil 40 and on the surface of copper foil 48. As shown in FIG. 10(A), electrolytic copper plating is performed to form electrolytic plated film (54b) on electroless plated film (54a). Accordingly, electrolytic plated film (54b) is filled in penetrating hole (46A). As shown in FIG. 10(B), etching resist 56 is formed on portions where conductive patterns (58A, 58B) are formed.

As shown in FIG. 10(C), copper foils (40, 48), electroless plated film (54a) and electrolytic plated film (54b) are etched away from the portions where etching resist 56 is not formed. In doing so, first conductive pattern (58A) is formed on second surface (S) of insulation layer 46, and second conductive pattern (58B) is formed on first surface (F) of insulation layer 46.

FIG. 2(E) shows a magnified view of a stud bump surrounded by circle (e1) in FIG. 10(C). The portion protruding from copper foil 40 in end portion 32 of stud bump 30 in semiconductor element 20 is covered with electroless plated film (54a) and electrolytic copper-plated film (54b).

As shown in FIG. 10(D), solder-resist layer (70B) having opening (71B) is formed on first surface (F) of insulation layer 46. Solder-resist layer (70A) having opening (71A) is formed on second surface (S) of insulation layer 46. Then, solder bump (76A) is formed in opening (71A), and solder bump (76B) is formed in opening (71B). Accordingly, circuit board 10 is manufactured (see FIG. 1).

In a method for manufacturing a circuit board according to the first embodiment, first, recessed portion 41 is formed in support member 60, and stud bump 30 of semiconductor element 20 is positioned in recessed portion 41. By contrast, in the above-described conventional technology, first, a semiconductor element is mounted on a support member, and then a laser is irradiated to form an opening for exposing a pad of the semiconductor element. Namely, in the present embodiment, there is no such step for irradiating a laser at a terminal (pad) of a semiconductor element as in conventional technology. Therefore, in the present embodiment, there is no risk for a pad of a semiconductor element to be damaged by a laser. Also, stud bump 30 of semiconductor element 20 accommodated in insulation layer 46 protrudes from second surface (S) of insulation layer 46. Thus, it is easy to sufficiently secure the contact area with conductive pattern (58A) formed on second surface (S) of insulation layer 46, and connection reliability is enhanced between the terminal and the conductive pattern.

Second Embodiment

Figure 11:
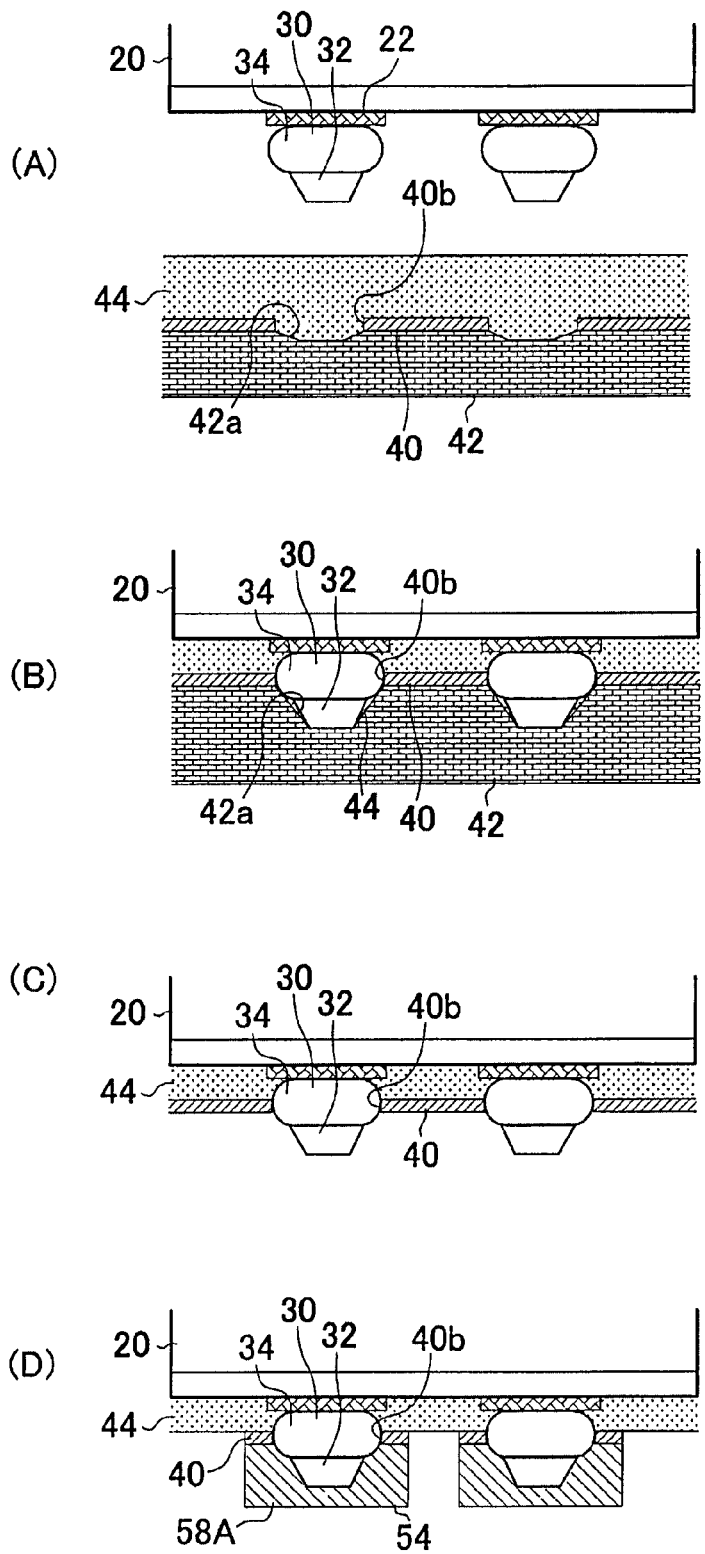
FIGS. 11(A)-(D) are views of steps for manufacturing a circuit board according to a second embodiment.

A method for manufacturing a circuit board according to the second embodiment is described with reference to FIG. 11. In the above-described first embodiment, the diameter of penetrating hole (40a) is formed to be substantially the same as the diameter of end portion 32 so that end portion 32 of stud bump 30 makes contact with the inner wall of penetrating hole (40a) in copper foil 40. By contrast, in the second embodiment, the diameter of penetrating hole (40b) in copper foil 40 is set greater than the diameter of end portion 32 of stud bump 30 (see FIG. 11(A)).

First, stud bump 30 of semiconductor element 20 is aligned with penetrating hole (40b) in copper foil 40 (FIG. 11(A)). Then, the tip of end portion 32 of the stud bump makes contact with the bottom of recessed portion (42a). At this stage, semiconductor element 20 is fixed using adhesive agent 44 (FIG. 11(B)). The subsequent manufacturing process is the same as that described in the first embodiment (see FIGS. 11(C) and 11(D)).

In the second embodiment, since the diameter of penetrating hole (40b) in the copper foil is set greater than that of end portion 32 of stud bump 30, even if the positional accuracy of stud bump 30 over penetrating hole (40b) is low, their connection reliability is ensured. In addition, in the second embodiment, base 34 of stud bump 30 makes contact with the inner wall of penetrating hole (40b) in the copper foil so that semiconductor element 20 is solidly fixed.

Modified Example of Second Embodiment

Figure 12:
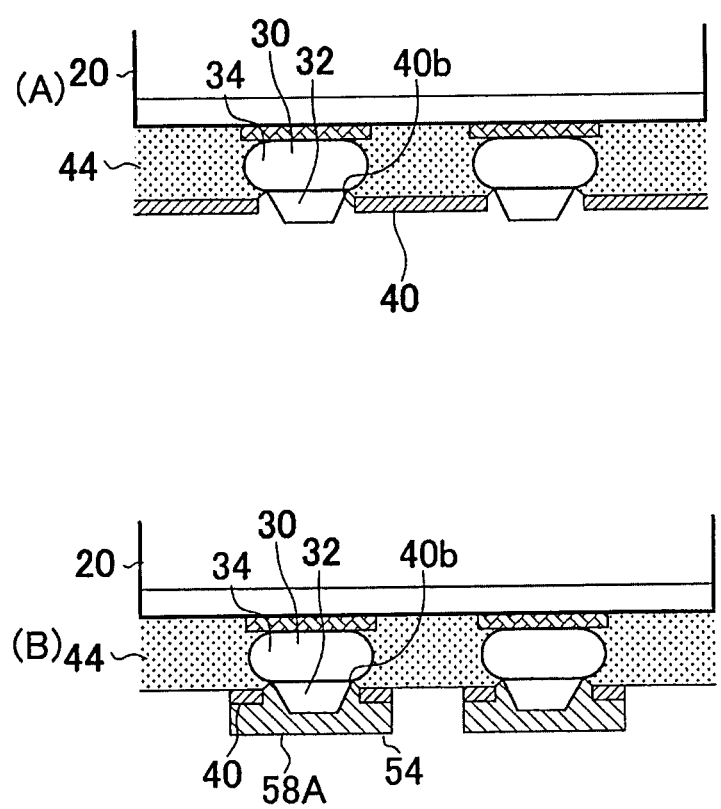
FIGS. 12(A)-12(B) are views of steps for manufacturing a circuit board according to a modified example of the second embodiment.

A method for manufacturing a circuit board according to a modified example of the second embodiment is described with reference to FIG. 12. In the modified example, the tip portion of stud bump 30 is exposed as shown in FIG. 11(C) in the second embodiment, and then adhesive agent 44 in penetrating hole (40b) is removed by ashing (FIG. 12(A)). Then, by forming plated film 54, conductive pattern (58b) is formed (FIG. 12(B)). In a modified example of the second embodiment, the contact area is sufficiently secured between plated film 54 and stud bump 30, resulting in the advantage that their bonding reliability is further enhanced.

Third Embodiment

Figure 13:
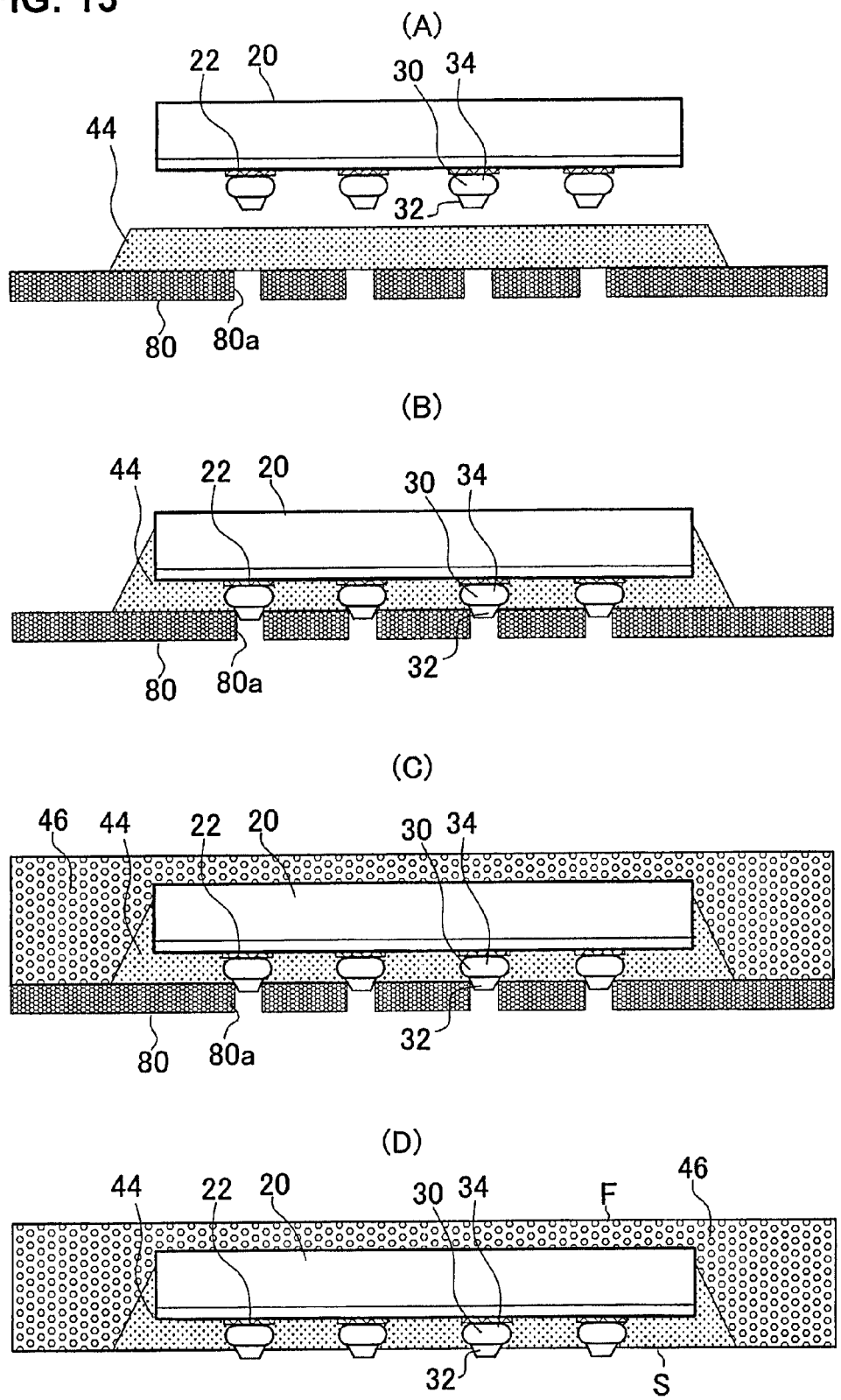
FIGS. 13(A)-13(D) are views of steps for manufacturing a circuit board according to a third embodiment.
Figure 14:
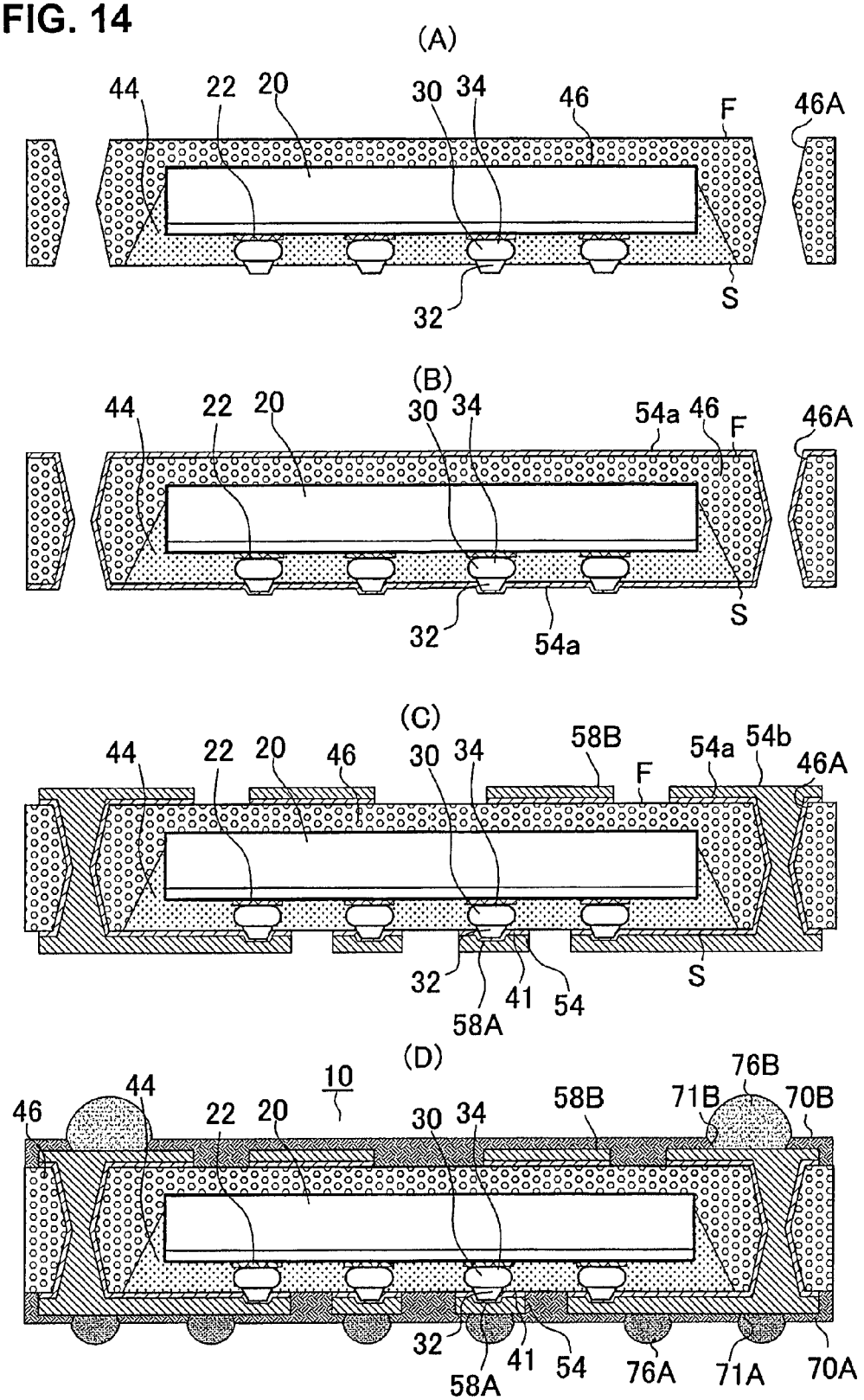
FIGS. 14(A)-14(D) are views of steps for manufacturing a circuit board according to a modified example of the third embodiment.

With reference to FIGS. 13 and 14, a method for manufacturing a circuit board according to the third embodiment is described. In the above-described first embodiment and second embodiment, support member 60 with copper foil 40 is used. However, instead of a support member with copper foil, resin film is used in the third embodiment. First, as shown in FIG. 13(A), resin film 80 having multiple penetrating holes (80a) is prepared, and adhesive agent 44 is applied in a region where penetrating holes (80a) are formed. Then, stud bumps 30 of semiconductor element 20 are aligned with penetrating holes (80a) in resin film 80. As shown in FIG. 13(B), end portion 32 of stud bump 30 is inserted in penetrating hole (80a). In doing so, semiconductor element 20 is fixed.

Next, by encapsulating semiconductor element 20 with predetermined resin, insulation layer 46 is formed (FIG. 13(C)). Then, as shown in FIG. 13(D), resin film 80 is removed. At that time, at least part of end portion 32 of stud bump 30 is exposed from second surface (S) of insulation layer 46.

As shown in FIG. 14(A), penetrating hole (46A) is formed in insulation layer 46. Penetrating hole (46A) is formed by irradiating a laser from first surface (F) and from second surface (S) of insulation layer 46 respectively. As shown in FIG. 14(B), electroless plated film (54a) is formed on the entire surface of insulation layer 46 including the inner wall of penetrating hole (46A). As shown in FIG. 14(C), by forming electrolytic plated film (54b) on electroless plated film (54a), and by etching the plated films at required portions, conductive patterns (58A, 58B) and through-hole conductor 36 are formed. Then, by performing the same treatment as in the first embodiment, circuit board 10 is manufactured (FIG. 14(D)).

Other Embodiments

Figure 15:
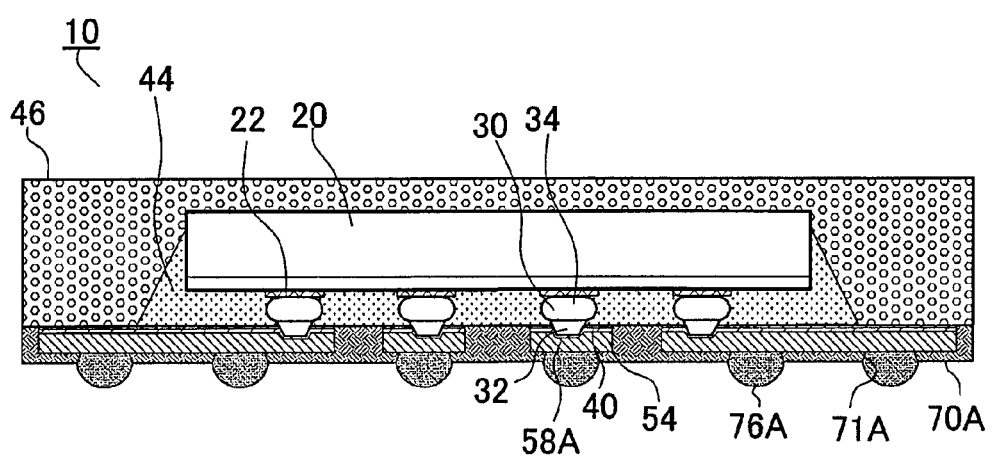
FIG. 15 is a cross-sectional view of a circuit board according to yet another embodiment.

As shown in FIG. 15, conductive pattern (58B) on first surface (F) of insulation layer 46 may be omitted. In such a case, through-hole conductor (36B) and solder-resist layer (70B) are also omitted, and the manufacturing process is simplified.

Figure 16:
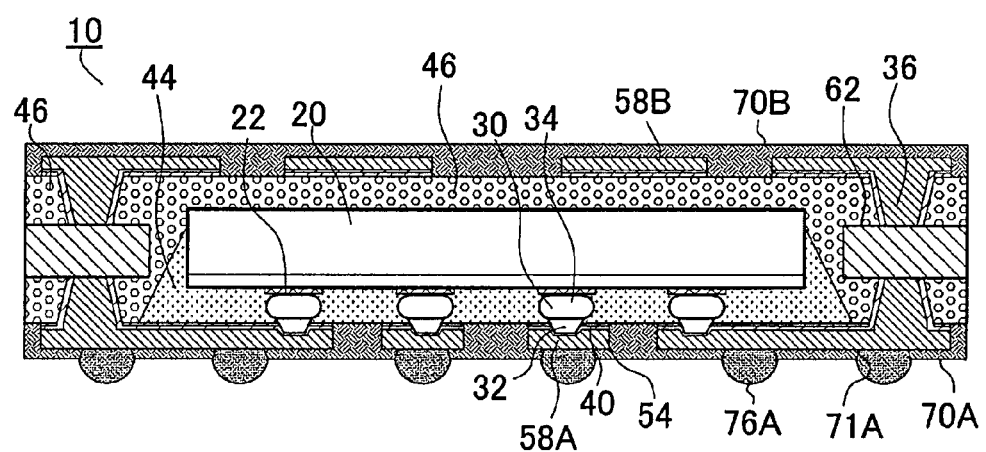
FIG. 16 is a cross-sectional view of a circuit board according to yet another embodiment.

As shown in FIG. 16, metal sheet 62 may be formed inside insulation layer 46. In such a case, rigidity is provided for insulation layer 46, and warping is suppressed in circuit board 10. Also, in the above embodiments, stud bump 30 is used as a terminal. However, it may be modified to use a post made of copper, for example. In addition, a thin-film capacitor and an inductor may be formed in circuit board 10. In doing so, voltage is supplied to a semiconductor element without incurring loss. Alternatively, underfill material may be used instead of adhesive agent 44. In such a case, after semiconductor element 20 is mounted on support member 60, underfill material is filled directly under semiconductor element 20.

A circuit board according to an embodiment of the present invention has the following technological characteristics: an insulation layer having a first surface and a second surface opposite the first surface; an electronic component accommodated in the insulation layer and having a terminal; a conductive pattern formed on the second surface of the insulation layer and electrically connected to the terminal; and an insulative film formed on the second surface of the insulation layer and on the conductive pattern. In such a circuit board, at least part of the terminal protrudes from the second surface of the insulation layer.

A method for manufacturing a circuit board according to another embodiment of the present invention includes the following technological characteristics: preparing a support member; forming a recessed portion or a penetrating hole in the support member; inserting at least part of a terminal of an electronic component in the recessed portion or in the penetrating hole; forming an insulation layer on the support member and encapsulating the electronic component; removing the support member so that at least part of the terminal of the electronic component protrudes from the surface of the insulation layer; and on the surface of the insulation layer, forming a conductive pattern electrically connected to the terminal of the electronic component.

In a circuit board according to an embodiment of the present invention, the tip of a terminal of an electronic component accommodated in an insulation layer protrudes from a surface of the insulation layer. Thus, regarding a terminal of the electronic component, the entire portion protruding from the surface of the insulation layer makes contact with a conductive pattern. As a result, it is easy to sufficiently secure their contact area, and connection reliability between the terminal and the conductive pattern is enhanced. The same effect is achieved in a method for manufacturing a circuit board according to another embodiment of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A circuit board, comprising:
    an insulation layer having a first surface and a second surface on an opposite side of the first surface;
    an electronic component positioned in the insulation layer and having a terminal;
    a conductive pattern formed on the second surface of the insulation layer and electrically connected to the terminal; and
    an insulative film formed on the second surface of the insulation layer and on the conductive pattern,
    wherein the terminal of the electronic component has a protruding portion which protrudes from the second surface of the insulation layer, the conductive pattern has a first conductive film formed on the second surface of the insulation layer and a second conductive film formed on the first conductive film, and the first conductive film has an opening portion in which the protruding portion of the terminal of the electronic component is positioned such that the terminal of the electronic component is in contact with the second conductive film of the conductive pattern.

2. The circuit board according to claim 1, wherein the terminal of the electronic component is in direct contact with the conductive pattern.

3. The circuit board according to claim 1, wherein the protruding portion of the terminal of the electronic component is positioned in the opening portion of the first conductive film such that the protruding portion of the terminal is penetrating through the opening portion of the first conductive film of the conductive pattern.

4. The circuit board according to claim 3, wherein the terminal of the electronic component has a diameter which is smaller than a diameter of the opening portion of the first conductive film.

5. The circuit board according to claim 3, wherein the terminal of the electronic component is a stud bump.

6. The circuit board according to claim 3, wherein the first conductive film is a copper foil, and the second conductive film is made of copper plating.

7. The circuit board according to claim 3, wherein the terminal of the electronic component is in contact with an inner wall of the opening portion of the first conductive film.

8. The circuit board according to claim 3, wherein the insulation layer includes an adhesive agent adhering the conductive pattern and the electronic component and forming a portion of the second surface of the insulation layer.

9. The circuit board according to claim 1, wherein the terminal of the electronic component has a diameter which is smaller than a diameter of the opening portion of the first conductive film.

10. The circuit board according to claim 1, wherein the terminal of the electronic component is a stud bump.

11. The circuit board according to claim 1, wherein the first conductive film is a copper foil, and the second conductive film is made of copper plating.

12. The circuit board according to claim 1, wherein the terminal of the electronic component is in contact with an inner wall of the opening portion of the first conductive film.

13. The circuit board according to claim 1, wherein the insulation layer includes an adhesive agent adhering the conductive pattern and the electronic component and forming a portion of the second surface of the insulation layer.

14. The circuit board according to claim 1, further comprising a second conductive pattern formed on the first surface of the insulation layer.

15. The circuit board according to claim 14, further comprising a through-hole conductor penetrating through the insulation layer, wherein the insulation layer has a penetrating hole in which the through-hole conductor is formed such that the first conductive pattern is connected to the second conductive pattern.

16. The circuit board according to claim 1, wherein the terminal of the electronic component has a diameter which is smaller than a diameter of the opening portion of the first conductive film, the terminal of the electronic component is a stud bump, and the first conductive film is a copper foil, and the second conductive film is made of copper plating.

17. A method for manufacturing a circuit board, comprising:
    forming one of a recessed portion and a penetrating hole in a support member;

inserting a portion of a terminal of an electronic component in the one of the recessed portion and the penetrating hole;

forming an insulation layer on the support member such that the electronic component is encapsulated in the insulation layer;

removing the support member from a surface of the insulation layer such that the portion of the terminal of the electronic component protrudes from the surface of the insulation layer; and forming on the surface of the insulation layer a conductive pattern such that the conductive pattern is electrically connected to the terminal of the electronic component, wherein the conductive pattern has a first conductive film formed on the surface of the insulation layer and a second conductive film formed on the first conductive film, and the first conductive film has an opening portion in which the protruding portion of the terminal of the electronic component is positioned such that the terminal of the electronic component is in contact with the second conductive film of the conductive pattern.

18. The method for manufacturing a circuit board according to claim 17, wherein the forming of one of the recessed portion and the penetrating hole comprises forming the recessed portion in the support member, and the inserting of the portion of the terminal comprises inserting the portion of the terminal of the electronic component in the recessed portion formed in the support member.

19. The method for manufacturing a circuit board according to claim 18, wherein the support member comprises a resin sheet and a metal film on the resin sheet, and the forming of the recessed portion comprises forming the recessed portion such that the recess portion penetrates through the metal film.

20. The method for manufacturing a circuit board according to claim 18, wherein the forming of the recessed portion comprises forming the recessed portion having a diameter which is set greater than a diameter of the portion of the terminal in the support member.

* * * * *